United States Patent [19]

Stoisiek

[11] Patent Number: 4,509,069
[45] Date of Patent: Apr. 2, 1985

[54] LIGHT TRIGGERABLE THYRISTOR WITH CONTROLLABLE EMITTER-SHORT CIRCUIT AND TRIGGER AMPLIFICATION

[75] Inventor: Michael Stoisiek, Ottobrunn, Fed. Rep. of Germany

[73] Assignee: Siemens Aktiengesellschaft, Berlin & Munich, Fed. Rep. of Germany

[21] Appl. No.: 416,333

[22] Filed: Sep. 9, 1982

[30] Foreign Application Priority Data

Sep. 29, 1981 [DE] Fed. Rep. of Germany ....... 3138763

[51] Int. Cl.³ ............................................. H01L 29/74
[52] U.S. Cl. ........................................ 357/38; 357/30; 357/35; 357/43; 357/86; 307/252 A; 307/252 C; 307/570
[58] Field of Search ..................... 357/30, 38, 35, 86, 357/43; 307/570, 252 A, 252 C

[56] References Cited

U.S. PATENT DOCUMENTS 4,224,634 9/1980 Suedberg ............................. 357/38
4,244,000 1/1981 Ueda et al. .......................... 357/38

Primary Examiner—Joseph E. Clawson, Jr.
Attorney, Agent, or Firm—Hill, Van Santen, Steadman & Simpson

[57] ABSTRACT

A light-triggerable power thyristor having controllable emitter short circuits in the form of MIS transistors which are conductive in the blocking condition of the thyristor and suppressed during the ignition operation. An optically controlled npn lateral transistor is integrated on the cathode side of the thyristor in the light-irradiated emitter region, the collector of the npn lateral transistor being connected to the gates of the MIS transistors, its emitter being formed by a part of the thyristor emitter and its base consisting of a part of the p-base of the thyristor. The gates of the MIS transistors are connected to the anode of the thyristor over a charging resistor.

5 Claims, 2 Drawing Figures

LIGHT TRIGGERABLE THYRISTOR WITH CONTROLLABLE EMITTER-SHORT CIRCUIT AND TRIGGER AMPLIFICATION

BACKGROUND

1. Field of the Invention

The present invention relates to a light triggerable thyristor, and more particularly to one having controllable emitter short circuits.

2. The Prior Art

In my earlier co-pending application, Ser. No. 370,574, filed Apr. 21, 1982, a light triggerable thyristor with a controllable emitter short circuit is disclosed. In order to trigger such a thyristor, however, a control voltage pulse is required to energize MIS structures, in addition to the light pulse. In addition, if the advantages of light triggering are to be obtained with security against disruptions, with a stable decoupling of the thyristor from the drive circuit which generates the control voltage, the drive circuit must be designed as a rather complicated opto-coupler arrangement. It is therefore desirable to provide a simpler arrangement for such a thyristor.

BRIEF DESCRIPTION OF THE PRESENT INVENTION

A principle object of the present invention is to provide a thyristor of the light triggerable type, in which the control of the emitter short circuits and the ignition of the thyristor are produced in a simple manner from the illumination of the thyristor surface.

In one embodiment of the present invention, a thyristor is provided having controllable emitter short circuits in the form of MIS transistors and an optically controlled npn lateral transistor is provided at the surface of the thyristor and coupled to the gates of the MIS transistors.

An advantage of this arrangement lies in the fact that the electrical energy stored in the gate capacitors of the MIS structures during the blocking condition is employed for ignition, so that ignition takes place with a relatively low control power.

These and other objects and advantages of the present invention will become manifest by an inspection of the following description and the accompanying drawings.

BRIEF DESCRIPTION OF THE DRAWINGS

Reference will now be made to the accompanying drawings in which.

DESCRIPTION OF THE PREFERRED EMBODIMENT

Figure 1:
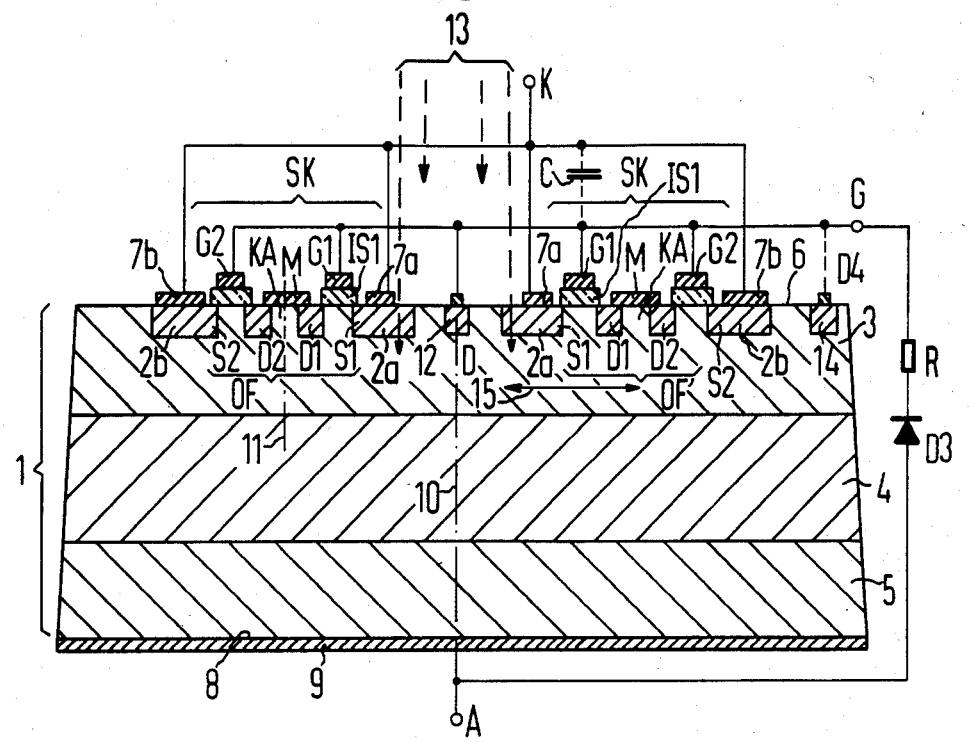
FIG. 1 is a cross-sectional view of an illustrative embodiment of a thyristor incorporating the present invention.

The thyistor of FIG. 1 has a body 1 consisting of mono-crystalline semiconductor material, for example, silicon, which contains n-conductive layers 2a, 2b and 4, and p-conductive layers 3 and 5. The layer consisting of two parts 2a and 2b is also referred to as the n-emitter; the layer 3 as the p-base, the layer 4 as the n-base, and the layer 5 as the p-emitter. At the boundary surface 6 of the semiconductor body 1, the parts 2a and 2b of the n-emitter are provided with coatings 7a and 7b consisting of electrically conductive material, for example, aluminum, which together form the cathode of the thyristor. They are connected to a terminal K. The p-emitter 5 is contacted on the opposite boundary surface 8 of the semiconductor body by an anode 9 consisting of electrically conductive material, for example, aluminum. The anode 8 is provided with a terminal A.

In FIG. 1, the n-emitter 2a, 2b is provided with controllable emitter short circuits SK which respectively consist of a MIS field effect transistor, such as S1, D1, G1 or S2, D2, G2, a projection KA of the p-base 3 extending up to the boundary surface 6, and a metallization bridge M placed on the boundary surface 6. The edge area 51 of the n-emitter part 2a constitutes a source region. A drain region D1 is n+ doped. A gate G1 consisting of conductive material is separated from the surface 6 by a thin, electrically insulating layer IS1, and is wired to a terminal G. The drain, source and gate form a MIS transistor which produces a low-resistance connection from the projection KA over M to the n-emitter part 2a in its conductive condition. In an analogous manner, the parts S2, D2 and G2 form a second MIS transistor which produces a low-resistance connection between KA and the part 2b of the n-emitter in its conductive condition. The metallization bridge connects the projection KA to the drain regions D1 and D2.

When the thyristor arrangement according to FIG. 1, including the controllable emitter short circuits SK, is designed dynamically balanced relative to an axis 10, then the MIS structures respectively lie at the outer edge of an annular n-emitter part 2b. In an alternative embodiment, a plurality of such MIS structures can respectively separate a plurality of annular, concentric n-emitter parts from one another. However, the n-emitter parts 2a, 2b can also be designed strip-like and be flanked by strip-shaped MIS structures in a finger-like arrangement. Further, the arrangment according to FIG. 1 can also be designed in such manner that, instead of the mutually separated n-emitter parts 2a and 2b, a self-contained n-emitter 2a, 2b is provided which is provided with a plurality of openings OF and OF' which are as uniformly distributed as possible. In this case, the reference symbols D1 and D2 only indicate different planes of section of one and the same annular n+ doped drain region which is centrally symmetric relative to an axis 11. S1 and S2 then indicate different planes of section of one and the same edge zone of the n-emitter 2a, 2b surrounding the openings OF. The drive procedure and the manner of functioning of the controllable emitter short circuits SK remain the same as described above in these alternative embodiments.

When the gate voltage, i.e. the voltage at G1 and G2 supplied over G, is zero relative to the part of the p-base 3 lying below it, then the field effect transistors S1, G1, D1 and S2, G2, D2 are blocked, the emitter short circuits are suppressed, and the thyristor is in a condition of high trigger sensitivity. By means of applying a positive gate voltage, the short-circuits can be switched on and the thyristor can be placed in a trigger-insensitive and stable condition.

In order to control the MIS field effect transistors, the control terminal G of the field effect transistors is connected to the anode terminal A over a high-resistance, current-limiting resistor R and a diode D3. In addition, there is a connection from G to the terminal of a further n+ doped zone 12, such further n+ doped zone 12 being situated in tight proximity to the inside edge of the n-emitter 2a. The inside edge of 2a forms the emitter, the region 12 forms the collector, and the part of the p-base of the thyristor coming to the surface between these regions forms the base of a light-controlled npn lateral transistor. As soon as a positive voltage is applied to the anode 9, this voltage is also conducted over the resistor R and the diode D3 to the control terminal G, and places the thyristor in a trigger-insensitive condition. Then the voltage at the capacitors of the gates G1 and G2 can at most be as great as the break-down voltage of the pn junction between the region 12 and the p-base 3, i.e. approximately 10 through 20 volts.

When, for the purpose of initiating a triggering, the thyristor is irradiated with light (indicated as 13 in FIG. 1), then a large part of the light penetrates through the irradiated n-emitter region up to the space charge zone of the pn junction between the layers 3 and 4 and, in a known manner, produces a photo-electric current which serves as the ignition current of the thyristor. At the same time, the base region of the npn lateral transistor is irradiated, and renders it conductive to discharge the gate capacitors of the MIS transistors. The MIS transistors are thereby blocked and the thyrisor is placed in a trigger-sensitive condition. Because of the relatively large gate capacitances of the MIS transistors, a strong discharge current functioning as an additional ignition current surge flows in the p-base 3. This additional ignition current surge can be further increased by the parallel connection of an external capacitor C to the MOS capacitor.

The threshold voltage of the MIS transistors should be small enough that the forward voltage adjacent to the anode 9 after triggering suffices to again switch the emitter shorts on. It is only then, given the return of a rapid rise of the positive voltage applied to terminal A which follows a shut-down of the thyristor, that the thyristor is protected against dV/dt ignition.

When the light beam 13 is switched off before the thyristor is fully conductive, then the emitter short circuits must be prevented from becoming immediately effective and leading to an inhibition of the lateral trigger propagation. This can occur in that the time constant of the RC element formed of the MIS capacitors and the charging resistor R is selected greater than the propagation time of the ignition front.

In general, the voltage adjacent to the anode 9 is significantly greater in the blocking condition of the thyristor than the break-down voltage of the npn transistor, which can lead to an undesired ignition of the thyristor. Therefore, the resistor R must be selected large enough that the current flowing over D remains small enough that it leads neither to the ignition of the thyristor nor to the destruction of the collector-base diode D.

According to a further development of the invention, a second diode D4, which exhibits a n+ doped region 14 connected to the terminal G, is provided in a trigger-insensitive edge region of the thyristor. The break-down voltage of D4 is selected lower than that of the collector-base diode D. The diode D4 limits the gate voltage at G1 and G2. According to a circuit alternative, D4 can also be replaced by an external diode.

Figure 2:
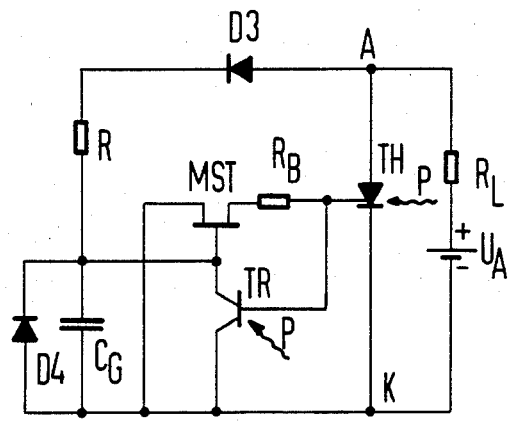
FIG. 2 is an equivalent circuit diagram of the arrangement of FIG. 1.

An equivalent circuit diagram of the arrangement illustrated in FIG. 1 is shown in FIG. 2. The thyristor TH is connected over a load resistor $R_L$ to an anode voltage source $U_A$. The MIS transistor MST comprising the short circuits SK which can be connected between the cathodes 7a, 7b and the p-base 3 of the thyristor. $R_B$ denotes the track resistance of the semiconductor body from the inside edge of the illuminated emitter region 2a up to the first short-circuit structure, i.e. along the double arrow 15; $C_G$ denotes the gate capacitance of the MIS transistor MST; R denotes the charging resistor; and D3 denotes the diode over which the capacitor $C_G$ is charged by the anode voltage of the thyristor. D4 is the integrated or externally connected diode for gate voltage limitation. TR comprises the npn lateral transistor whose emitter is formed by the inner edge region of the thyristor emitter. In the blocking condition of the thyristor, the voltage between K and the control electrode is so low that a noticeable electron injection occurs neither in the transistor TR nor in the thyristor. At the collector of the transistor TR, therefore, the break-down voltage of its collector-base junction of that of the diode D4 occurs, depending upon which of the two is smaller. The gate capacitor of the MIS transistor MST is charged to this voltage; the MIS transistor MST is therefore in its conductive condition. For triggering the thyristor, light (P) is simultaneously beamed into the p-base 3 of the thyristor and into the base of the npn transistor TR. TR becomes current-conductive and leads to the discharge of $C_G$ over the terminal K. When the discharge current of $C_G$ is large enough, it leads to the ignition of the thyristor at the inner edge 16 of the illuminated emitter region.

Since the discharge current of $C_G$ is greater than the photo-electric current generated by the illumination as a result of the current transfer ratio $\beta$, the current can be relatively large for only a small light power, if only the current transfer ratio $\beta$ is sufficiently large. Thus, the present invention provides an integrated ignition current amplification, whereby a part of the ignition energy is supplied by the anode voltage source during the conducting and blocking periods and is stored in the gate capacitors of the MIS transistors until ignition.

Further, in contrast to the above description, the emitter short circuits SK as well as the npn lateral transistor can also be disposed at the p-emitter 5. FIG. 1 can be employed for illustrating this circuit alternative when the conductivity types of the semiconductor regions are replaced by those with the respectively opposite type, the terminals A and K are interchanged and the described voltages and currents are supplied with the respectively opposite polarity.

It will be appreciated by those skilled in the art that various modifications and additions may be made without departing from the essential features or novelty of the present invention, which are intended to be defined and secured by the appended claims.

What is claimed:

1. A light-triggerable thyristor having a semiconductor body with an n-emitter contacted by a cathode, an adjacent p-base, a p-emitter contacted by an anode, and an adjacent n-base, a plurality of emitter short circuits disposed at one boundary surface of the semiconductor body in the form of MIS transistors, each MIS transistor comprising an edge region of the n(p)-emitter, an n(p)-conductive semiconductor region inserted into the p(n)-base covered by a gate, a lateral transistor provided at the light-irridated boundary surface, said lateral transistor comprising an edge region of the n(p)-emitter, a further n(p)-conductive semiconductor region inserted into the p(n)-base which is connected to the gates of the MIS transistors, and a sub-region of the p(n)-base lying therebetween; and means for connecting the gates of the MIS transistors to the anode.

2. The light-triggerable thyristor according to claim 1, including means for connecting the gates of the MIS transistors to the anode over the series connection of a charging resistor and a diode.

3. The thyristor according to one of the claims 1 or 2, including means for connecting of the MIS transistors to the cathode over a capacitor.

4. The thyristor according to one of the preceding claims, including means for connecting a further diode in parallel with the pn junction between the p(n)-base and the further n(p)-conductive semiconductor region inserted into the p(n)-base.

5. The thyristor according to claim 4, wherein said further diode is integrated into the p(n)-base.

* * * * *